United States Patent
Bi et al.

(10) Patent No.: US 10,141,313 B2
(45) Date of Patent: *Nov. 27, 2018

(54) FINFET WITH UNIFORM SHALLOW TRENCH ISOLATION RECESS

(71) Applicant: INTERNATIONAL BUSINESS MACHINES CORPORATION, Armonk, NY (US)

(72) Inventors: Zhenxing Bi, Niskayuna, NY (US); Kangguo Cheng, Schenectady, NY (US); Juntao Li, Cohoes, NY (US); Peng Xu, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/819,577

(22) Filed: Nov. 21, 2017

(65) Prior Publication Data

US 2018/0254273 A1   Sep. 6, 2018

Related U.S. Application Data

(63) Continuation of application No. 15/450,725, filed on Mar. 6, 2017, now Pat. No. 9,865,598.

(51) Int. Cl.
*H01L 21/00*   (2006.01)
*H01L 21/84*   (2006.01)
(Continued)

(52) U.S. Cl.
CPC .... *H01L 27/0924* (2013.01); *H01L 21/31053* (2013.01); *H01L 21/31111* (2013.01);
(Continued)

(58) Field of Classification Search
None
See application file for complete search history.

(56) References Cited

U.S. PATENT DOCUMENTS 9,837,404 B2 * 12/2017 Sung .................... H01L 27/0886
2017/0278844 A1 * 9/2017 Sung .................... H01L 27/0886

OTHER PUBLICATIONS

List of IBM Patents or Patent Applications Treated as Related; (Appendix P), Filed Nov. 22, 2017; 2 pages.
(Continued)

*Primary Examiner* — Thien F Tran
(74) *Attorney, Agent, or Firm* — Cantor Colburn LLP; Vazken Alexanian

(57) ABSTRACT

Disclosed herein are processes and structures for uniform STI recessing. A method of making a semiconductor device includes initially forming a dense region of at least two fins on a substrate. The fins have a hard mask layer on a surface. The dense region with the fins is adjacent to an isolated region without fins within a distance of a pitch of the fins. An oxide is deposited on the dense and isolated regions. The oxide is polished, stopping on the hard mask layer on the fins, and removing more oxide in the isolated region. Polishing results in forming a non-uniform oxide surface. The hard mask layer is removed from the fins. An etch process is performed to further recess the oxide in the dense and isolated regions, such that a thickness of the oxide in the dense region and the isolated region is substantially uniform.

20 Claims, 7 Drawing Sheets

(51) Int. Cl.
*H01L 27/092* (2006.01)
*H01L 21/311* (2006.01)
*H01L 21/3105* (2006.01)
*H01L 21/8238* (2006.01)

(52) U.S. Cl.
CPC .......... *H01L 21/31144* (2013.01); *H01L 21/823821* (2013.01); *H01L 21/823878* (2013.01)

(56) References Cited

OTHER PUBLICATIONS

Zhenxing Bi, et al., "FinFET With Uniform Shallow Trench Isolation Recess", U.S. Appl. No. 15/450,725, filed Aug. 25, 2017.

\* cited by examiner

FINFET WITH UNIFORM SHALLOW TRENCH ISOLATION RECESS

PRIORITY

This application is a continuation of and claims priority from U.S. patent application Ser. No. 15/450,725, filed on Mar. 6, 2017, entitled "FINFET WITH UNIFORM SHALLOW TRENCH ISOLATION RECESS," the entire contents of which are incorporated herein by reference.

BACKGROUND

The present invention relates in general to complementary metal oxide semiconductor (CMOS) technology, and more specifically, to forming uniform shallow trench isolation (STI) recesses in FinFET devices.

CMOS technology is used to construct integrated circuits such as microprocessors, microcontrollers, static random access memory (RAM) and other digital logic circuits. A basic component of CMOS designs is metal oxide semiconductor field effect transistors (MOSFETs).

A FinFET is a type of MOSFET. The FinFET is a double-gate or multiple-gate MOSFET device that mitigates the effects of short channels and reduces drain-induced barrier lowering. The term "fin" refers to the narrow channel between source and drain regions. A thin dielectric layer on either side of the fin separates the fin channel from the gate.

FinFET devices are fabricated by forming a "dense" set of fins on a substrate adjacent to an "isolated" region without fins. The fins/devices in the dense region are separated by shallow trench isolation (STI) recesses in the substrate (or STI regions), which are filled with a dielectric oxide.

SUMMARY

According to one or more embodiments of the invention, a method of making a semiconductor device includes forming a dense region including at least two fins on a substrate, with the at least two fins having a hard mask layer arranged on a surface of the at least two fins. The dense region is arranged adjacent to an isolated region without fins within a distance of a pitch of one of the at least two fins. An oxide is deposited on the at least two fins of the dense region and on the isolated region of the substrate. The oxide is polished, stopping on the hard mask layer on the at least two fins of the dense region, and removing more oxide in the isolated region, such that polishing results in forming a non-uniform oxide surface. The hard mask layer is removed from the at least two fins. A etch process is performed to further recess the oxide in the dense region and the isolated region, such that a thickness of the oxide in the dense region and the isolated region is substantially uniform.

According to other embodiments of the invention, a method of making a semiconductor device includes forming a dense region including at least two fins on a substrate, with the dense region being arranged adjacent to an isolated region without fins. The at least two fins include a first hard mask layer and a second hard mask layer. An oxide is deposited on the at least two fins of the dense region and on the isolated region of the substrate. The oxide is polished, stopping on the second hard mask layer on the at least two fins of the dense region, and removing more oxide in the isolated region, such that polishing forms a non-uniform oxide surface. The hard mask layer is removed from the at least two fins, exposing the first hard mask layer. A wet etch process is performed to further recess the oxide in the dense region and the isolated region and remove the first hard mask layer from the at least two fins, such that the oxide in the dense region and the isolated region is substantially uniform in thickness, and to expose tops of the at least two fins.

Yet, according to other embodiments of the invention, a method of making a semiconductor device includes forming a dense region including at least two fins on a substrate, with the dense region being arranged adjacent to an isolated region without fins within a distance of a pitch of one of the at least two fins, and the at least two fins including a first hard mask layer and a second hard mask layer. An oxide is deposited on the at least two fins of the dense region and on the isolated region of the substrate, with the oxide filling regions between fins of the at least two fins and extending over the at least two fins. A portion of the oxide is removed from the dense region and a portion of the oxide is removed from the isolated region, such that more oxide is removed from the isolated region and a non-uniform oxide surface is formed. The hard mask layer is removed a selective etch process from the at least two fins, exposing the first hard mask layer and forming recesses in the oxide over the at least two fins. A wet etch process is performed to further recess the oxide in the dense region and the isolated region and remove the first hard mask layer, such that the oxide in the dense region and the isolated region is substantially uniform in thickness, and to expose tops of the at least two fins.

Still yet, according to other embodiments of the invention, a method of making a semiconductor device includes forming a dense region including at least two fins on a substrate, the dense region being arranged adjacent to an isolated region without fins, the at least two fins including a silicon oxide layer and a silicon nitride layer arranged thereon. An oxide is deposited on the at least two fins of the dense region and on the isolated region of the substrate. The oxide is polished, stopping on the silicon nitride layer on the at least two fins of the dense region, and removing more oxide in the isolated region, such that polishing forms a non-uniform oxide surface. The hard mask layer is removed from the at least two fins, exposing the silicon oxide layer. A wet etch process is performed to further recess the oxide in the dense region and the isolated region and remove the silicon oxide layer from the at least two fins, such that the oxide in the dense region and the isolated region is substantially uniform in thickness, and to expose tops of the at least two fins.

According to one or more embodiments of the invention, a semiconductor device includes a dense region including at least two fins on a substrate, the at least two fins having a fin pitch. A first hard mask layer is arranged on the at least two fins, and a second hard mask layer is arranged on the first hard mask layer. An isolated region without fins is arranged on the substrate adjacent to the dense region, the isolated region being free of fins within a distance equal to or greater than the fin pitch of the at least two fins. An oxide is arranged on and around the at least two fins of the dense region and on the substrate of the isolated region. A recess is formed in the oxide of the isolated region that has a thickness that is equal to a thickness of the second hard mask layer on the at least two fins.

BRIEF DESCRIPTION OF THE DRAWINGS

The subject matter which is regarded as embodiments of the invention is particularly pointed out and distinctly claimed in the claims at the conclusion of the specification. The foregoing and other advantages of the embodiments of the invention are apparent from the following detailed description taken in conjunction with the accompanying drawings in which:

FIGS. 1-5 illustrate exemplary methods of making semiconductor devices according to one or more embodiments of the invention, in which:

FIG. 1 is a cross-sectional side view of fins patterned in a dense region of a substrate, adjacent to an isolated region of the substrate without fins;

FIG. 2 is a cross-sectional side view after depositing shallow trench isolation (STI) oxide on the substrate;

FIG. 3 is a cross-sectional side view after performing a planarization/polishing process;

FIG. 4 is a cross-sectional side view after removing hard mask layers from the fins; and FIG. 5 is a cross-sectional side view after performing a wet etch to expose the fins;

DETAILED DESCRIPTION

Figure 1:
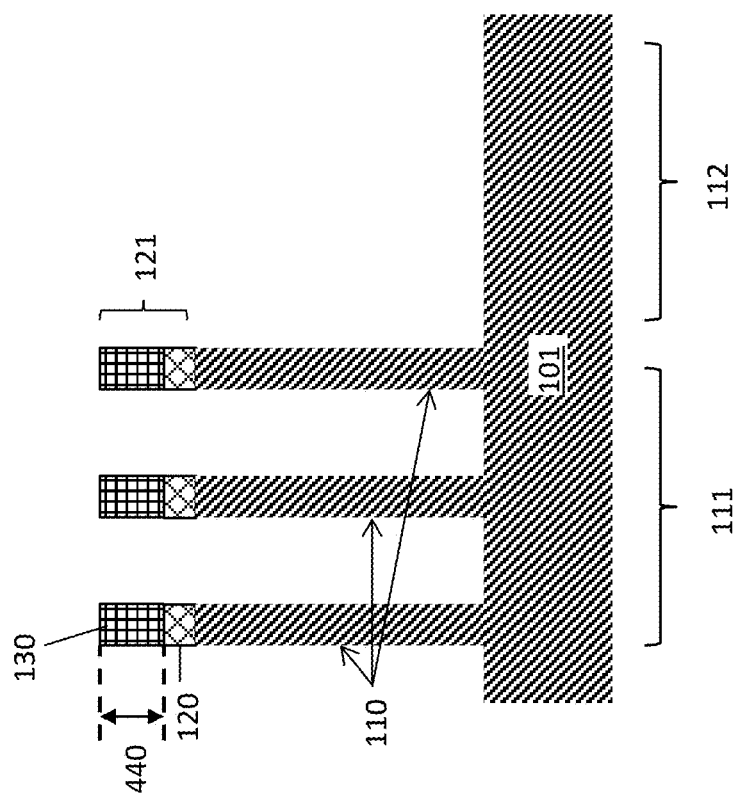

Embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature or characteristic, but every embodiment may or may not include the particular structure or characteristic. Moreover, such phrases are not necessarily referring to the same embodiment. Further, when a particular structure or characteristic is described in connection with an embodiment, it is submitted that it is within the knowledge of one skilled in the art to affect such structure or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

As used herein, the terms "about," "substantially," "approximately," and variations thereof are intended to include the degree of error associated with measurement of the particular quantity based upon the equipment available at the time of filing the application. For example, "about" can include a range of ±8% or 5%, or 2% of a given value.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to aspects of the present invention, shallow trench isolation (STI) recesses play an important role in fin height/pitch control, which can affect device performance. For example, the contact resistance, $I_{eff}$ and DIBL can be impacted by the fin height or STI recess variations. However, there are various challenges involved in STI recessing in FinFET devices. For example, the quality of STI gap filling material can result in STI recess variation and non-uniform height fins. Variations in patterning density (or micro loading) also can result in STI recess variation. In another example, low thermal budgets and annealing constraints can give way to non-uniform STI material quality. In general, using wet etch chemistry, for example, buffered hydrofluoric acid (BHF) to recess the STI regions will result in deeper recesses in dense region of the substrate (with fins) and shallower recess in the open or isolated region (without fins). BHF etches perform differently than dry etch chemistries, for example, $NH_3$ and HF based processes, which recess dense regions slower than isolated regions.

Accordingly, embodiments of the invention described herein provide methods and structures for forming uniform STI recesses in FinFET structures. According to one or more embodiments of the invention, the upstream STI profile is manipulated by using a hard mask on the fins to planarize/polish the STI oxide and then selectively etching the hard mask to counterweigh the downstream etching non-uniformity and loading.

Turning now to a detailed description of aspects of the present invention, FIGS. 1-5 illustrate exemplary methods of making semiconductor devices according to one or more embodiments. FIG. 1 is a cross-sectional side view of fins 110 patterned in a dense region 111 of a substrate 101, adjacent to an isolated region 112 of the substrate 101. Non-limiting examples of suitable substrate 101 materials include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof.

Two or more fins 110 are formed in the dense region 111. For example, a plurality of fins, are formed in the substrate 101 by a suitable method. The dense region 111 is adjacent to the isolated region 112, which does not include fins. In one or more embodiments, the isolated region 112 does not include any fins within a distance of, or greater than, the pitch (height) of the fins 110 in the dense region 111. In other embodiments, the isolated region 112 does not include any fins within a distance of at least 100 nanometers (nm). In some embodiments, the isolated region 112 without fins is an open area of the substrate 101 that does not include fins within a distance equal to or greater than a pitch of one of the at least two fins.

The fins 110 can be patterned in the substrate 101 by, for example, sidewall imaging transfer according to some embodiments. The fin height/pitch can generally vary, as it depends on the type of device, and is not intended to be limited. According to one or more embodiments, each fin 110 has a fin pitch in a range from about 20 to about 100 nm.

A two layer hard mask 121 is formed on a surface of the fins 110. The two layer hard mask 121 includes a first hard mask layer 120 and a second hard mask layer 130. The first hard mask layer 120 and the second hard mask layer 130 are different hard mask materials. The two layer hard mask 121 can be formed on the fins 110 before or after patterning.

In one or more embodiments, the first hard mask layer 120 is silicon dioxide, and the second hard mask layer 130 is silicon nitride. Other non-limiting examples of materials for the first hard mask layer 120 and the second hard mask layer 130 include dielectric oxides, dielectric nitrides, dielectric oxynitrides, SiOCN, SiBCN, or any combination thereof.

The thicknesses of the first hard mask layer 120 and the second hard mask layer 130 generally varies and is not intended to be limited. Although the first hard mask layer 120 appears to be thinner than the second hard mask layer 130, the layers can have the same, or about the same, thicknesses in some embodiments. In other embodiments, the first hard mask layer 120 can be thicker than the second hard mask layer 130.

According to one or more embodiments, the first hard mask layer 120 is formed on the substrate 101, and the second hard mask layer 130 is deposited on the first hard mask layer 120 and used as a pattern to then etch the fins 110 in the substrate and form the structure shown in FIG. 1.

Figure 3:
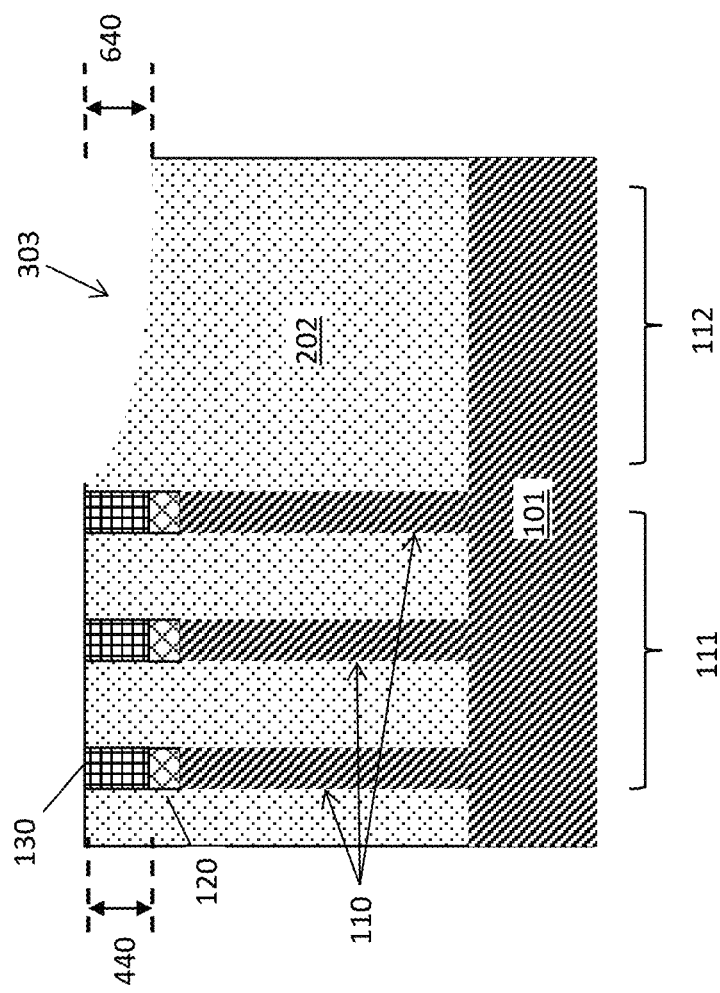

The thickness 440 of the second hard mask layer 130, as well as the patterning density variations have an effect on the degree of oxide dishing that occurs during subsequent process (as shown in FIG. 3). According to one or more embodiments, the thickness 440 of the second hard mask layer 130 is in a range from about 5 to about 20 nanometers (nm). According to other embodiments, the thickness 440 of the second hard mask layer 130 is in a range from about 10 to about 15 nm.

Figure 2:
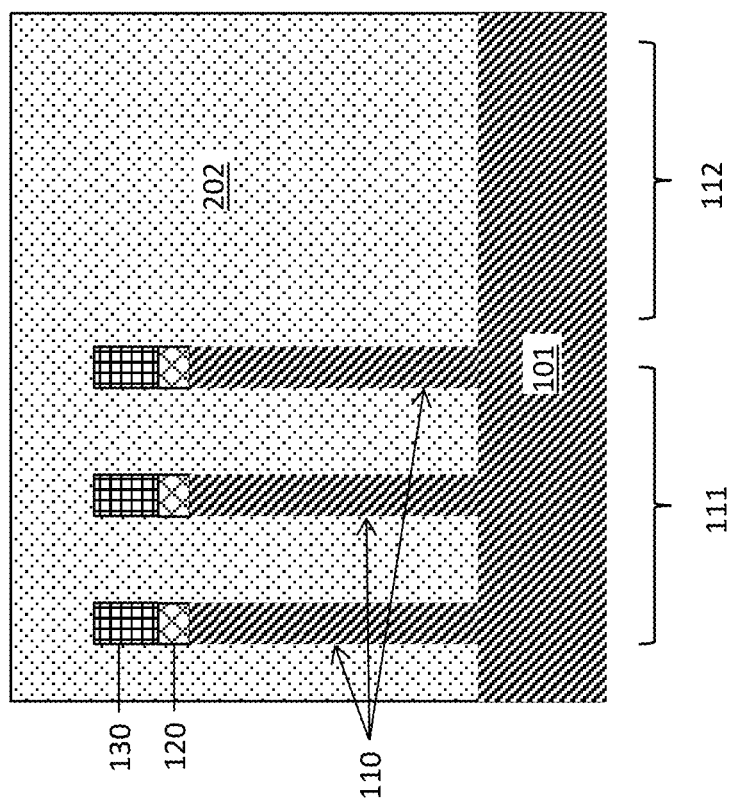

FIG. 2 is a cross-sectional side view after depositing shallow trench isolation (STI) oxide 202 on the substrate 101, and on and around the fins 110 of the dense region 111. The oxide 202 fills regions between the fins 110 and extends over the fins 110. The oxide 202 is also deposited on the substrate 101 of the isolated region 112. The conformal coating of oxide 202 covers both the fins 110 of the dense region 111 and the isolated region 112. The oxide 202 is silicon oxide in one or more embodiments. Other non-limiting examples of materials for the oxide 202 include spin-on-glass, flowable oxides, high density plasma oxides, borophosphosilicate glass (BPSG), or any combination thereof.

FIG. 3 is a cross-sectional side view after performing a planarization process (or polishing process) to planarize/polish the surface of the oxide 202. The planarization process is a chemical mechanical planarization (CMP) according to one or more embodiments. The planarization polishes the oxide 202, stopping on the second hard mask layer 130 on the fins 110 in the dense region 111. The second hard mask layer 130 protects the fins. At the same time, more oxide 202 is removed in the isolated region, which is also called "dishing." Dishing results in a recess 303 in the isolated region 112, while the second hard mask layer 130 protects the fins 110 and the oxide 202 in the dense region 111. A non-uniform surface is formed on the oxide 202. The oxide 202 is recessed by an amount (or thickness) 640, provided the second hard mask layer 130 has a thickness of 440. The amount 640 is equal to the thickness 440 of the second hard mask layer 130 (discussed in further detail with reference to FIG. 4). Dishing results from the regions of the substrate 101 having different densities (dense region 111 compared to isolated region 112). The degree of dishing can also be tuned by CMP process control, slurry selection, etc.

Figure 4:
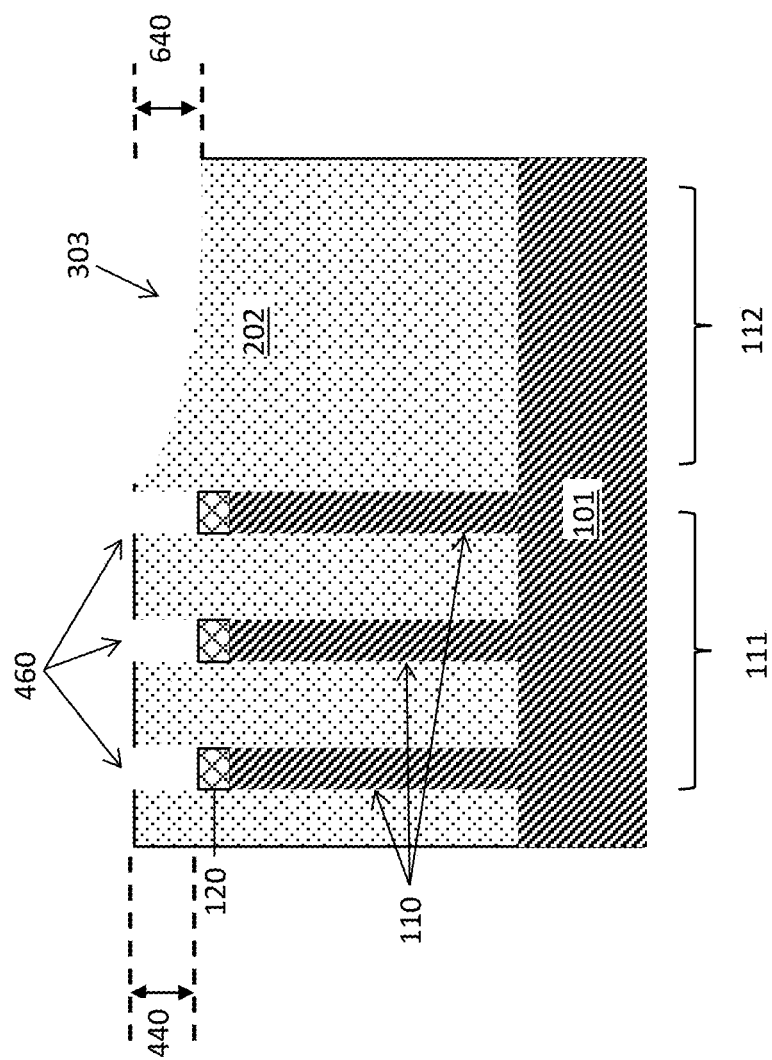

FIG. 4 is a cross-sectional side view after removing the second hard mask layers 130 from the fins 110. The second hard mask layer 130 is removed by a selective etch process. According to one or more embodiments, the second hard mask layer 130 is silicon nitride, and the selective etch process is a reactive ion etch (RIE). The selective etch process forms recesses 460 in the oxide 202 and exposes the first hard mask layer 120. The recesses 460 have a height that corresponds to the thickness 440 of the second hard mask layer 130, which is, for example, about 5 nm to about 20 nm in some embodiments, or about 10 nm to about 15 nm in other embodiments. The height of the recesses 460 (and second hard mask layer 130) is also equal to the amount 640 of dishing, or the thickness of oxide 202 that is removed in the isolated region 112 below that removed in the dense region. The amount 640 of dishing in the isolated region 112 is therefore about 5 nm to about 20 nm in some embodiments, and about 10 nm to about 15 nm in other embodiments. In some embodiments, the thickness 440 of the second hard mask layer 130 (and the recesses 460) is equal to a difference in thickness of the oxide 220 in the dense region 111 and the isolated region 112 after polishing.

Figure 5:
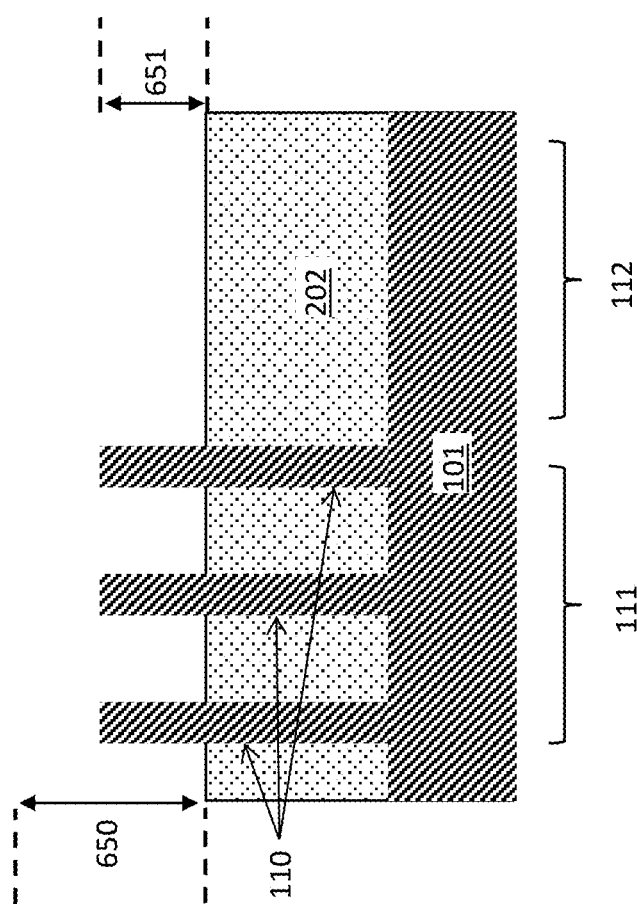

FIG. 5 is a cross-sectional side view after performing a wet etch process to expose the tops of the fins 110 through the oxide 202 in the dense region 111. The first hard mask layer 120 on the fins 110 is also removed. The wet etch is performed on the substrate 101 in both the dense region 111 and the isolated region 112. The natures of the wet chemical etch process results in the dense region 111 being etched at a faster rate than the isolated region 112. Thus, the amount of oxide 202 removed from the dense region 111 catches up with the isolated region 112, which includes the recess 303 formed from dishing, resulting in a substantially uniform etched oxide surface, having a substantially uniform thickness in both the dense region 111 and the isolated region 112.

The oxide 202 in the dense region 111 is etched by an amount 650, and the oxide 202 in the isolated region is etched by an amount 651, which is less than amount 650. According to one or more embodiments of the invention, the amount 650 is in a range from about 70 nm to about 150 nm, or from about 90 nm to about 110 nm. According to other embodiments, the amount 651 is in a range from about 20 nm to about 100 nm, or from about 40 nm to about 60 nm.

The wet etch process used can be any suitable wet etch process. In one or more embodiments, the wet etch process is a buffered hydrofluoric acid (BHF) wet etch process. Other non-limiting examples of wet etch processes that can be used include hydrofluoric acid (HF), hydrofluoric nitric acid (HNA), phosphoric acid, HF diluted by ethylene glycol (HFEG), hot ammonia, tetramethylammonium hydroxide (TMAH), hydrochloric acid (HCl), or any combination thereof.

Figure 6:
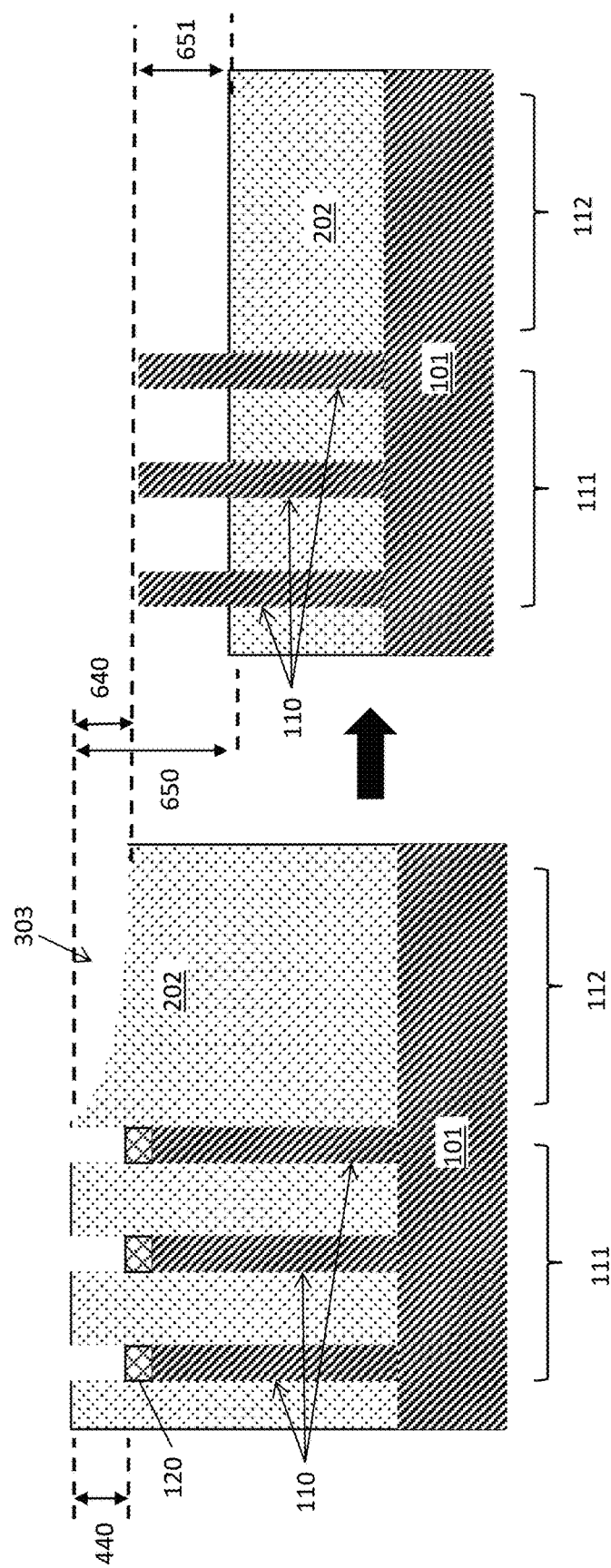
FIG. 6 is a cross-sectional side view comparing the structures formed in FIGS. 4 and 5.

FIG. 6 is a cross-sectional side view comparing the structures formed in FIGS. 4 and 5. The oxide 202 in the dense region 111 is etched by an amount 650, and the oxide 202 in the isolated region 112 is etched by a lesser amount 651. The difference between the amount 650 and the amount 651 is equal to the amount 640 of dishing that occurred during polishing (see FIG. 3), which is also equal to the thickness 440 of the second oxide layer 130 (see FIG. 3). Thus, a uniform oxide 202 surface occurs when the thickness 440 of the second oxide layer 130 equals the amount 640 of dishing that occurs during initial polishing.

Thus, the thickness 440 of the second oxide layer 130 on the fins 110 can be tuned/adjusted so that the amount 640 of dishing that occurs during polishing (see FIG. 3) is equivalent to provide a uniform oxide 202 surface after wet etching in the dense region 111 and isolated region 112. The material selected for the oxide 202 also can be tailored so that the thickness 440 equals the amount 640 of dishing.

The wet etch process (see FIG. 5) can also be tuned/adjusted to ensure that the thickness 440 of the second hard mask layer 130 equals the amount of dishing 640, which ultimately provides a uniform oxide 202 surface after the wet etch process. According to one or more embodiments, the wet etch process can be controlled by performing cyclic processing. For example, the isolated and dense region delta (difference) can be reduced from a cyclic etch. According to other embodiments, the wet etch process can be tuned by adjusting the ratio of acid and buffering agent, or adjusting the HF concentration.

The thickness 440 of the second hard mask layer 130 and the wet etch process can be adjusted and tailored so that thickness 440 equals the amount 640 of dishing, and therefore, so that the wet etch process that reveals the fins 110 (see FIG. 5) results in a uniform surface in the dense region 111 and the isolated region 112.

Figure 7:
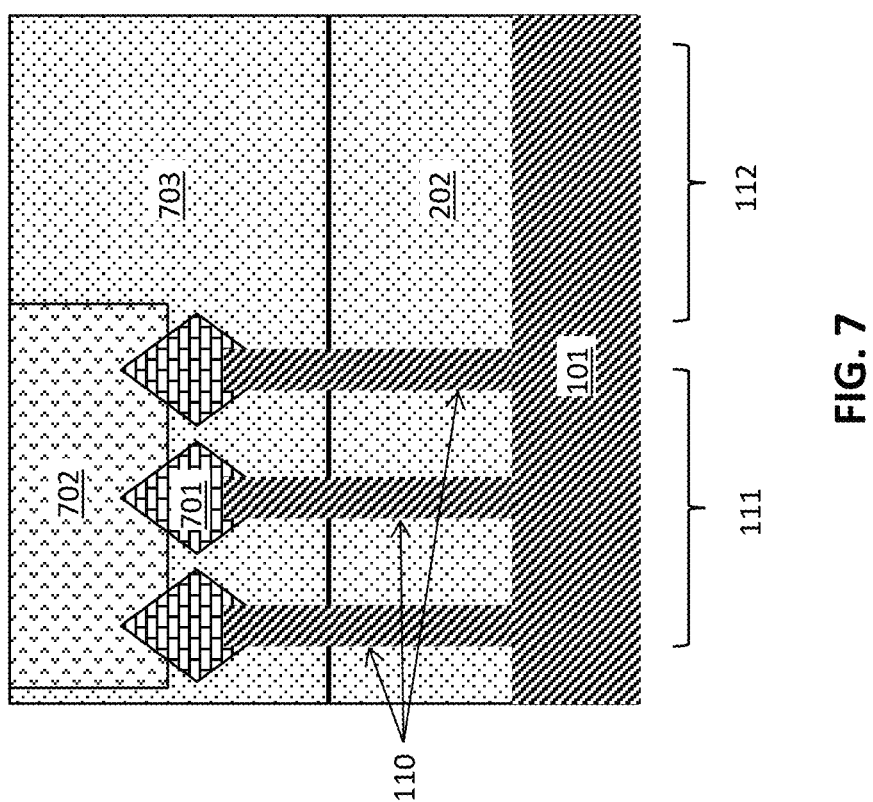
FIG. 7 is a cross-sectional side view of semiconductor device after forming source/drains and a contact on the fins according to one or more embodiments.

The devices formed in the previous process flows can be further processed downstream. FIG. 7 is a cross-sectional side view of a semiconductor device after forming source/drains 701 and a contact 702 on the fins 110 according to one or more embodiments. After recessing the oxide 202 by wet etching to form a uniform surface, source/drains 701 are formed on the fins 110. The source/drains 701 include epitaxial layers according to some embodiments. Epitaxial layers can be grown from gaseous or liquid precursors. Epitaxial growth can be grown using vapor-phase epitaxy (VPE), molecular-beam epitaxy (MBE), liquid-phase epitaxy (LPE), or other suitable process. The epitaxial silicon, silicon germanium, and/or carbon doped silicon (Si:C) can be doped during deposition by adding a dopant or impurity to form a silicide. The silicon can be doped with an n-type dopant (e.g., phosphorus or arsenic) or a p-type dopant (e.g., boron), depending on the type of transistor.

A dielectric layer 703 is deposited on the fins 110, and a contact trench is etched and filled with a conductive material to form the contact 702. The dielectric layer 703 can be the same material as oxide 202 or a different dielectric. The dielectric layer 703 can be formed from, for example, a low-k dielectric material (with k<4.0), including but not limited to, silicon oxide, spin-on-glass, a flowable oxide, a high density plasma oxide, borophosphosilicate glass (BPSG), or any combination thereof.

The contact trenches are filled with a conductive material, and optionally, a liner according to one or more embodiments. The conductive material filling the contact 702 can be a conductive metal, for example, aluminum (Al), platinum (Pt), gold (Au), tungsten (W), titanium (Ti), or any combination thereof. T The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of making a semiconductor device, the method comprising:
    forming a dense region comprising at least two fins on a substrate, the dense region being arranged adjacent to an isolated region without fins;
    depositing an oxide on the at least two fins of the dense region and on the isolated region of the substrate;
    removing a portion of the oxide, removing more oxide in the isolated region, such that polishing results in forming a non-uniform oxide surface; and
    performing an etch process to further recess the oxide in the dense region and the isolated region, such that a thickness of the oxide in the dense region and the isolated region is substantially uniform.

2. The method of claim 1, wherein the etch process is a wet etch process.

3. The method of claim 2, wherein the wet etch process comprises buffered hydrofluoric acid.

4. The method of claim 1, wherein the oxide is silicon dioxide.

5. The method of claim 1, wherein the isolated region without fins is an open area of the substrate that does not include fins within a distance of a pitch of one of the at least two fins.

6. The method of claim 1, wherein removing a portion of the oxide is by a polishing method.

7. The method of claim 6, wherein the polishing method is chemical mechanical planarization.

8. The method of claim 1, wherein the etch process comprises buffered hydrofluoric acid, hydrofluoric acid, hydrofluoric nitric acid, phosphoric acid, HF diluted by ethylene glycol, hot ammonia, tetramethylammonium hydroxide, hydrochloric acid, or any combination thereof.

9. The method of claim 1, wherein, before depositing the oxide, the at least two fins comprise a first hard mask layer and a second hard mask layer arranged thereon.

10. The method of claim 9, wherein the first hard mask layer is a silicon oxide layer, and the second hard mask layer is a silicon nitride layer.

11. The method of claim 10, wherein removing a portion of the oxide comprises stopping on the silicon nitride layer on the at least two fins of the dense region.

12. The method of claim 11, wherein the silicon nitride layer is removed from the at least two fins before performing the etch process.

13. The method of claim 12, wherein the silicon oxide layer is exposed after the silicon nitride layer is removed.

14. The method of claim 13, wherein tops of the at least two fins are exposed after performing the etch process.

15. The method of claim 10, wherein a thickness of the silicon nitride layer is equal to a difference in thickness of the oxide in the dense region and isolated region after removing a portion of the oxide.

16. The method of claim 9, wherein the first hard mask layer or the second hard mask layer is a dielectric oxide, a dielectric nitride, a dielectric oxynitride, or any combination thereof.

17. The method of claim 9 wherein the first hard mask layer or the second hard mask layer is SiOCN, SiBCN, or any combination thereof.

18. The method of claim 1, wherein the isolated region does not include any fins within a distance of at least 100 nanometers (nm).

19. The method of claim 1, wherein the isolated region does not include fins within a distance equal to a pitch of one of the at least two fins.

20. The method of claim 19, wherein the pitch is in a range from about 20 to about 100 nm.

* * * * *